(12) United States Patent
Hung et al.

(10) Patent No.: US 7,682,890 B2
(45) Date of Patent: Mar. 23, 2010

(54) METHOD OF FABRICATING SEMICONDUCTOR DEVICE

(75) Inventors: Wen-Han Hung, Kaohsiung (TW); Cheng-Tung Huang, Kaohsiung (TW); Li-Shian Jeng, Taitung (TW); Kun-Hsien Lee, Tainan (TW); Shyh-Fann Ting, Kaohsiung County (TW); Tzyy-Ming Cheng, Hsinchu (TW); Chia-Wen Liang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 720 days.

(21) Appl. No.: 11/465,455

(22) Filed: Aug. 18, 2006

(65) Prior Publication Data

US 2008/0042210 A1    Feb. 21, 2008

(51) Int. Cl.
*H01L 21/336* (2006.01)
*H01L 21/8234* (2006.01)
*H01L 21/8238* (2006.01)

(52) U.S. Cl. .................. 438/197; 438/199; 438/200; 438/201; 438/202; 438/216; 257/E21.632; 257/E21.66; 257/E21.661

(58) Field of Classification Search .......... 257/E21.632, 257/E21.66, E21.661
See application file for complete search history.

(56) References Cited

U.S. PATENT DOCUMENTS

| | | | | |
|---|---|---|---|---|
| 5,620,920 | A * | 4/1997 | Wilmsmeyer | ............... 438/227 |
| 6,573,172 | B1 | 6/2003 | En et al. | |
| 6,740,939 | B2 * | 5/2004 | Sayama et al. | ............... 257/371 |
| 2002/0113295 | A1 | 8/2002 | Nakamura | |
| 2004/0235236 | A1 | 11/2004 | Hoffmann et al. | |
| 2005/0199958 | A1 * | 9/2005 | Chen et al. | ................... 257/368 |
| 2005/0218455 | A1 * | 10/2005 | Maeda et al. | ................ 257/368 |
| 2006/0024879 | A1 * | 2/2006 | Fu et al. | ..................... 438/216 |
| 2007/0235817 | A1 * | 10/2007 | Wang et al. | ................... 257/392 |
| 2007/0238235 | A1 * | 10/2007 | Lee et al. | ..................... 438/197 |
| 2007/0249069 | A1 * | 10/2007 | Alvarez et al. | ................ 438/14 |

OTHER PUBLICATIONS

"1st Office Action of Taiwanese counterpart application", issued on Mar. 27, 2009, p. 1-p. 6.

* cited by examiner

*Primary Examiner*—Charles D Garber
*Assistant Examiner*—Mohsen Ahmadi
(74) *Attorney, Agent, or Firm*—Jianq Chyun IP Office

(57) ABSTRACT

A method of fabricating a semiconductor device is provided. A substrate is first provided, and then several IO devices and several core devices are formed on the substrate, wherein those IO devices include IO PMOS and IO NMOS, and those core devices include core PMOS and core NMOS. Thereafter, a buffer layer is formed on the substrate, and then the buffer layer except a surface of the IO PMOS is removed in order to reduce the negative bias temperature instability (NBTI) of the IO PMOS. Afterwards, a tensile contact etching stop layer (CESL) is formed on the IO NMOS and the core NMOS, and a compressive CESL is formed the core PMOS.

10 Claims, 7 Drawing Sheets

METHOD OF FABRICATING SEMICONDUCTOR DEVICE

BACKGROUND OF THE INVENTION

1. Field of the Invention

The present invention relates to a semiconductor device and a method of fabricating thereof. More particularly, the present invention relates to a semiconductor device and fabricating method thereof capable of improving negative bias temperature instability (NBTI) of the PMOS used as a input/output (IO) device.

2. Description of the Related Art

In the matter of the function, the semiconductor devices can be mainly distributed into IO devices and core devices. In accordance with electrical type of the devices, the IO devices further include a IO PMOS and a IO NMOS, wherein the IO PMOS represents a PMOS used as a IO device and the IO NMOS represents a NMOS used as a IO device. The core devices similarly include a core PMOS and a core NMOS.

The use of strained silicon has been utilized to improve the performance of the core device, but this manner is profitless to the reliability of a IO PMOS. Furthermore, the higher voltage is applied to the IO devices, especially the IO PMOS, so NBTI of the IO PMOS can not be reduced and thus the performance and reliability of the IO devices cannot be improved.

SUMMARY OF THE INVENTION

Accordingly, a main objective of the present invention is to provide a method of fabricating a semiconductor device capable of increasing the performance and reliability of a IO PMOS through simple manufacturing steps and preventing the diffusion of hydrogen atoms into the interface between silicon (Si) and silicon dioxide ($SiO_2$). The method has very little impact on the resistance (Rs) of the metal silicide layer.

Another main objective of the present invention is to provide a semiconductor device capable of eliminating the negative bias temperature instability (NBTI) in a IO PMOS so that the performance and the reliability of the device are improved.

To achieve these and other advantages and in accordance with the purpose of the invention, as embodied and broadly described herein, the invention provides a method of fabricating a semiconductor device. The method includes providing a substrate. Then, several IO devices and several core devices are formed on the substrate, wherein the IO devices include a IO PMOS and a IO NMOS and those core devises include core PMOS and core NMOS. Afterward, a buffer layer is formed on the substrate, and then the buffer layer except a surface of the IO PMOS is removed for reducing NBTI of the IO PMOS. Thereafter, a tensile contact etching stop layer (CESL) is formed the IO NMOS and the core NMOS, and a compressive CESL is formed the core PMOS.

According to the fabricating method in one embodiment of the present invention, the foregoing formation of the buffer layer may include forming a cover film on the IO NMOS and the core devices except the IO PMOS and then performing a surface treatment on the substrate to form the buffer layer. Moreover, the buffer layer is simultaneously removed by removing the cover film. The surface treatment may include an oxygen plasma treatment. The oxygen plasma treatment may include performing a physical vapor deposition (PVD) process or performing a treatment using a photoresist-stripping tool.

According to the fabricating method in another embodiment of the prevent invention, the method of forming the buffer layer may include chemical vapor deposition (CVD) process.

According to the fabricating method in the embodiment of the prevent invention, the compressive CESL is also formed over the buffer layer on the IO PMOS during covering the core PMOS.

According to the fabricating method in the embodiment of the prevent invention, the tensile CESL is also formed over the buffer layer on the IO PMOS during covering the IO NMOS and the core NMOS.

The present invention also provides a semiconductor device. The structure includes a substrate, several IO devices, several core device, a buffer layer, a tensile CESL and a compressive CESL, wherein the IO devices include IO PMOS and IO NMOS, and the core devises include core PMOS and core NMOS. The IO devices and the core device are disposed on the substrate. The buffer layer is disposed on a surface of the IO PMOS. The tensile CESL is on the IO NMOS and the core NMOS, and the compressive CESL is on the core PMOS.

According to the semiconductor device in one embodiment of the present invention, the compressive CESL is further disposed over the buffer layer.

According to the semiconductor device in one embodiment of the present invention, the tensile CESL is further disposed over the buffer layer.

According to the aforementioned method or structure in a embodiment of the present invention, the buffer layer includes an oxide film.

According to the aforementioned method or structure in a embodiment of the present invention, the buffer layer has a thickness between about 10 Å~200 Å.

In the present invention, a thin buffer layer is formed on the surface of the IO PMOS, and the buffer layer can stop the diffusion of hydrogen atoms into the interface between silicon and silicon oxide. Hence, the negative bias temperature instability (NBTI) of the IO PMOS can be eliminated or reduced without affecting the performance of other devices. Moreover, the buffer layer has very little impact on the resistance (Rs) of the underlying metal silicide layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A through 1E are schematic cross-sectional views showing the steps for fabricating a semiconductor device according to one preferred embodiment of the present invention, wherein FIGS. 1C-1 and 1C-2 represent different examples of forming the buffer layer, respectively.

FIG. 2 is a graph with curves showing an estimation of the NBTI between conventional IO PMOS and the ones fabricated according to one preferred embodiment of the present invention.

DESCRIPTION OF THE PREFERRED EMBODIMENTS

Figure 1A:
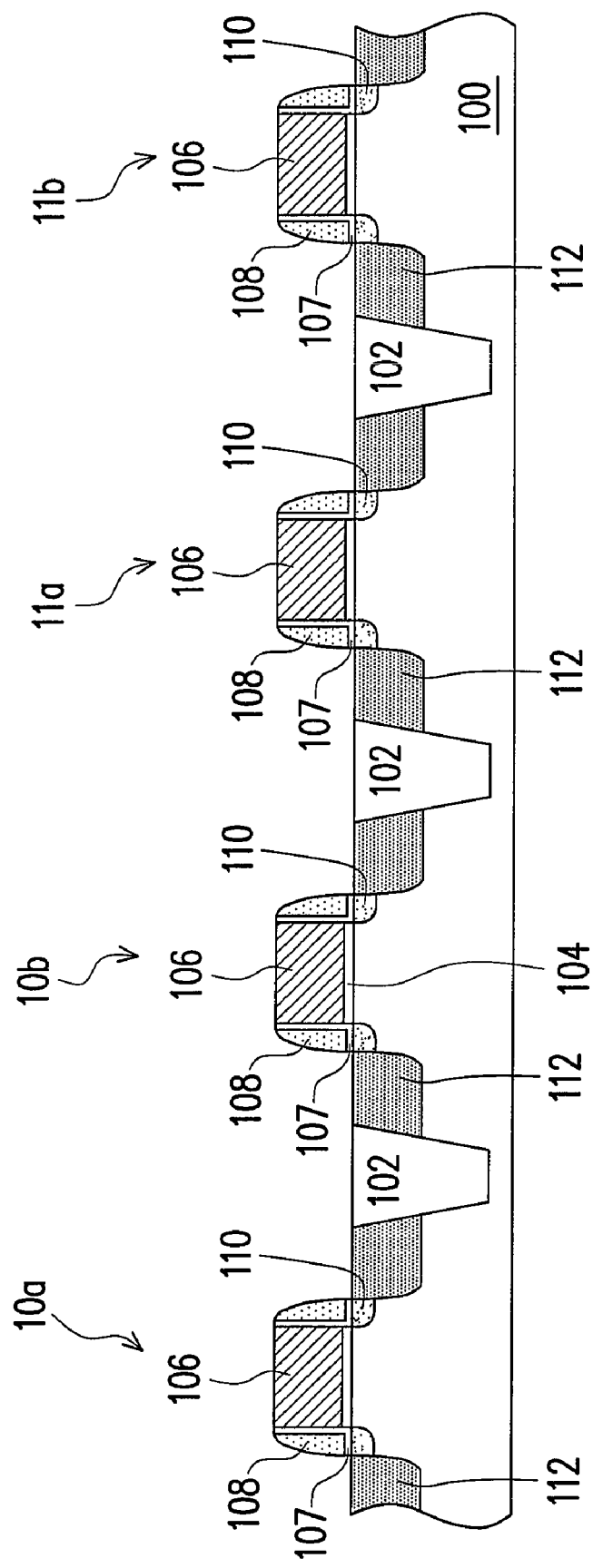

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1D are schematic cross-sectional views showing the steps for fabricating a semiconductor device according to one preferred embodiment of the present invention.

As shown in FIG. 1A, a substrate 100 with multiple isolation structures 102 is provided. Several IO devices 10a and 10b and several core devices 11a and 11b are formed on the substrate 100. The IO devices include a IO PMOS 10a and a IO NMOS 10b, and The core devices include a core PMOS 11a and a core NMOS 11b. The core device 11a and 11b, the IO PMOS 10a and the IO NMOS 10b respectively comprise a metal-semiconductor-oxide at least including a gate dielectric layer 104, a gate 106, a spacer 108, a lightly doped drain (LDD) 110 and a source/drain 112. The source/drain 112 can be formed in various methods; for example, a conventional ion implant process or a semiconductor material refilling process to form silicon-germanium (Si—Ge) refilled source/drain. Furthermore, an offset spacer 107 is often formed between the gate 106 and the spacer 108. The offset spacer 107 is fabricated using silicon oxide, for example.

Figure 1B:
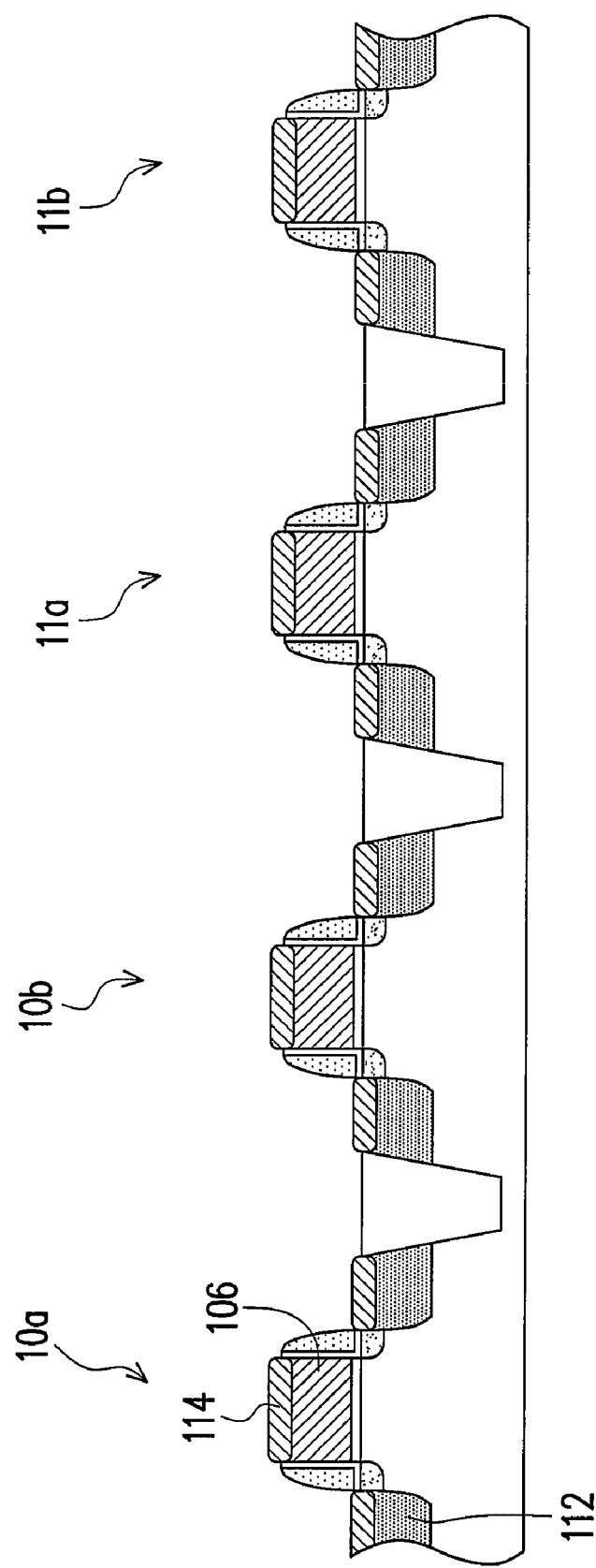

As show in FIG. 1B, a metal silicide layer 114 is optionally formed on the surface of the gate 106, the source/drain 112. The metal silicide layer 114 is fabricated using cobalt silicide, nickel silicide, tungsten silicide, titanium silicide, palladium silicide, tantalum silicide, platinum silicide, etc.

Figures 1, 1C:
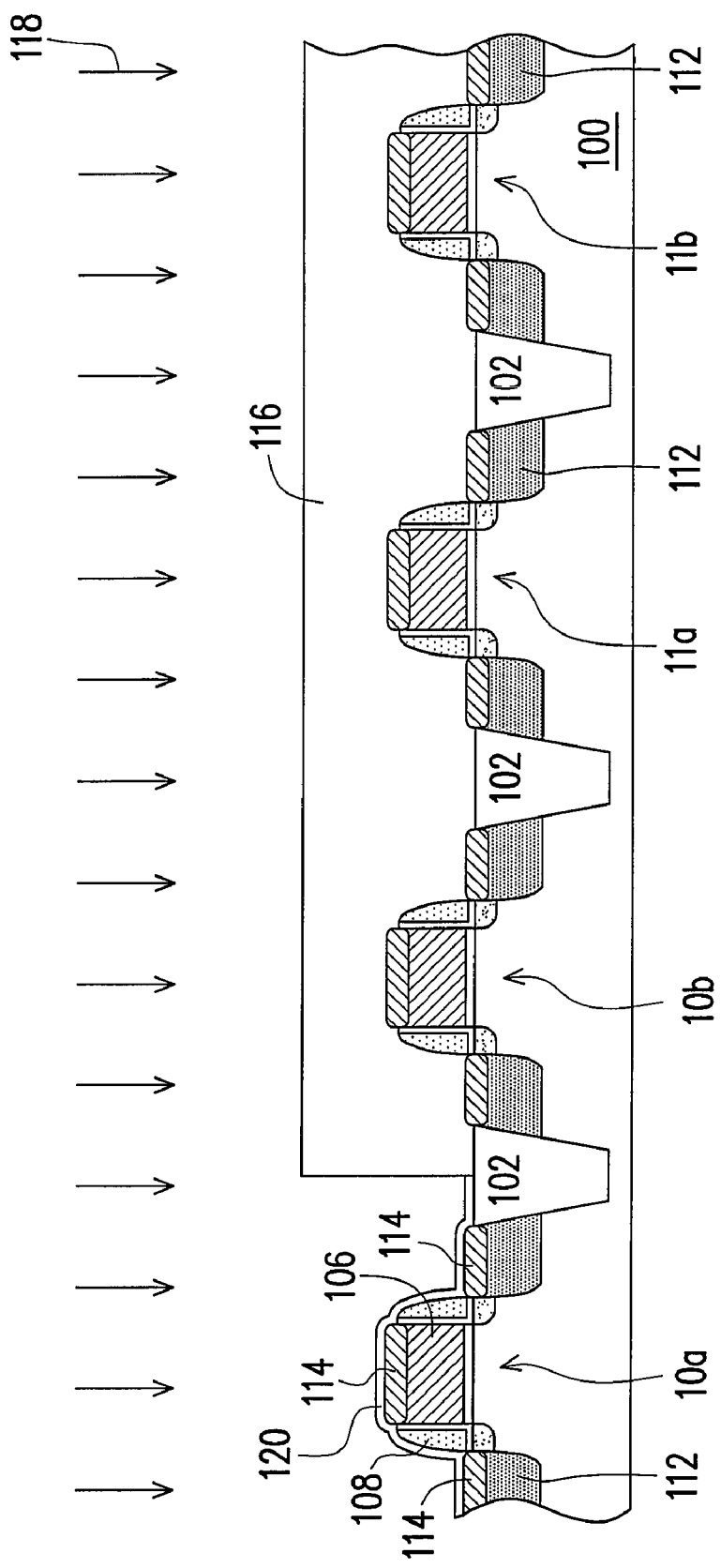
Figures 1, 1C, 2:
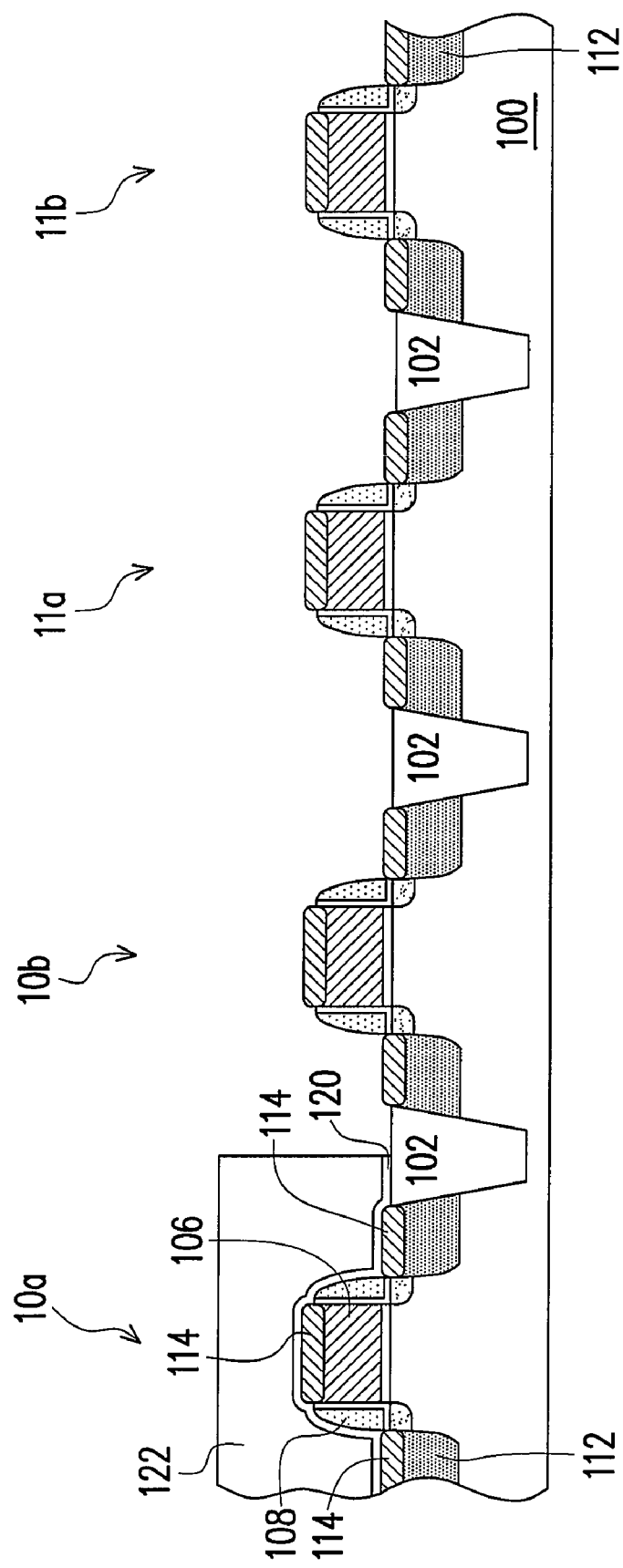

As show in FIG. 1C-1 and FIG. 1C-2, the two figures represent different exemplary processes of forming the buffer layer 120 of the present invention, respectively. In FIG. 1C-1, a cover film 116 is formed on the IO NMOS 10b and the core NMOS 11a and the core PMOS 11b except the IO PMOS 10a. Then, a surface treatment 118 is performed on the substrate 100 to form the buffer layer 120. The buffer layer 120 is a thin oxide film with a thickness between about 10 Å to 200 Å, for example, and thus has very little impact on the resistance (Rs) of the metal silicide layer 114. The foregoing surface treatment 118 can be a low-power oxygen plasma treatment ($O_2$ treatment). The oxygen plasma treatment includes performing a physical vapor deposition process or performing a treatment using a photoresist-stripping tool. For example, the oxygen plasma treatment is carried out under the following conditions and parameters: 1) using nitrous oxide ($N_2O$) as the gas for surface treatment, and performing the treatment 2) with a gas flow rate of between about 100~1000 sccm 3) for a duration of between about 20~100 seconds and 4) at a power rating between about 200~1000 W. Furthermore, the other devices on the substrate 100 are not in the least affected by the buffer layer 120 formed with the surface treatment 118, so the buffer layer 120 may be directly and fully formed over the substrate 100 without the cover layer 116 shown in FIG. 1C-1.

On the other hand, as show in FIG. 1C-2, the formation of buffer layer 120 may includes performing a chemical vapor deposition (CVD) process to fully deposit a layer of buffer material (not shown) on the substrate 100 and then removing a portion of the layer of buffer material besides the IO PMOS 10a. For example, a mask layer 122 is formed on the IO PMOS 10a, and a etching process is then carried out by utilizing the mask layer 122 as a etching mask, whereby removing the layer of buffer material over the IO NMOS 10b and the core PMOS 11a and the core NMOS 11b.

Figure 1D:
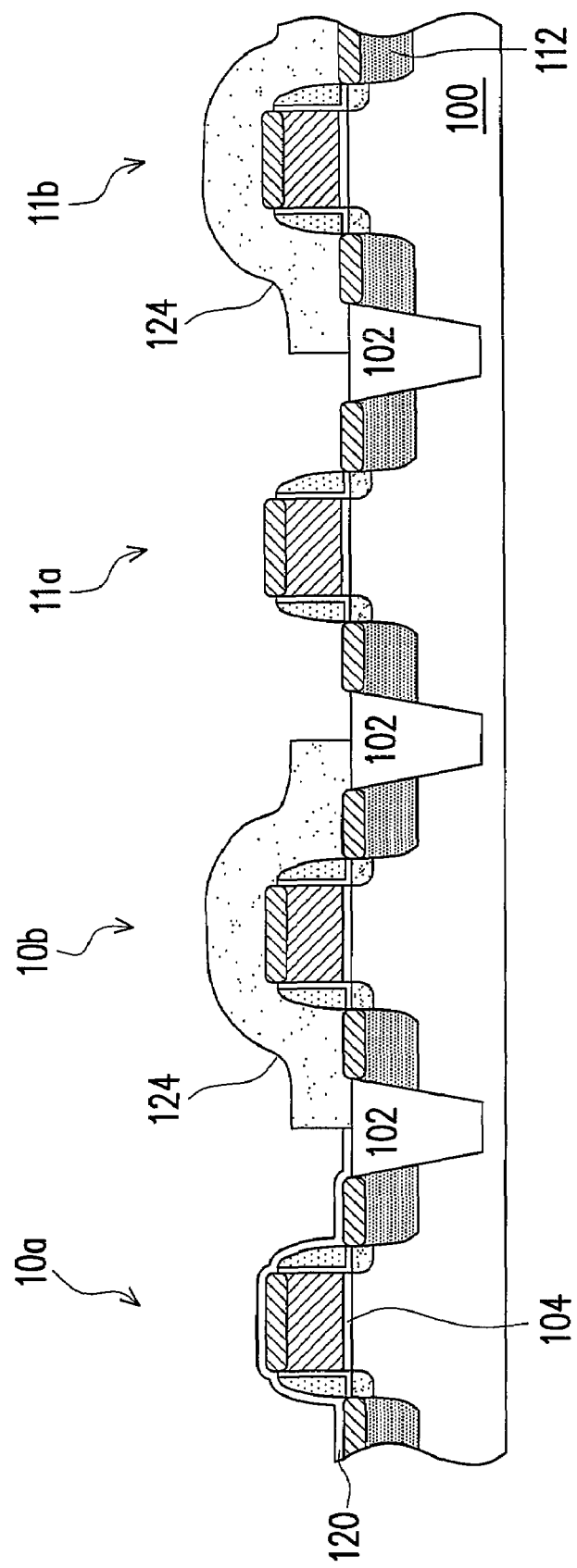

As shown in FIG. 1D, the cover layer 116 (shown in FIG. 1C-1) or the mask layer 122 (shown in FIG. 1C-2) is necessarily removed after the formation of the buffer layer 120 whether the method to form the buffer layer 120 is the surface treatment 118 or the CVD process. covering the metal silicide layer 118 in the p-type semiconductor device area 100a and the n-type semiconductor device area 100b is formed over the substrate 100 after the surface treatment 118. The buffer layer 120 can stop the diffusion of hydrogen atoms into the interface between silicon and silicon oxide, so the negative bias temperature instability (NBTI) of the IO PMOS 10a can be eliminated. Then, a tensile CESL 124 is formed over the IO NMOS 10b and the core NMOS 11b.

Figure 1E:
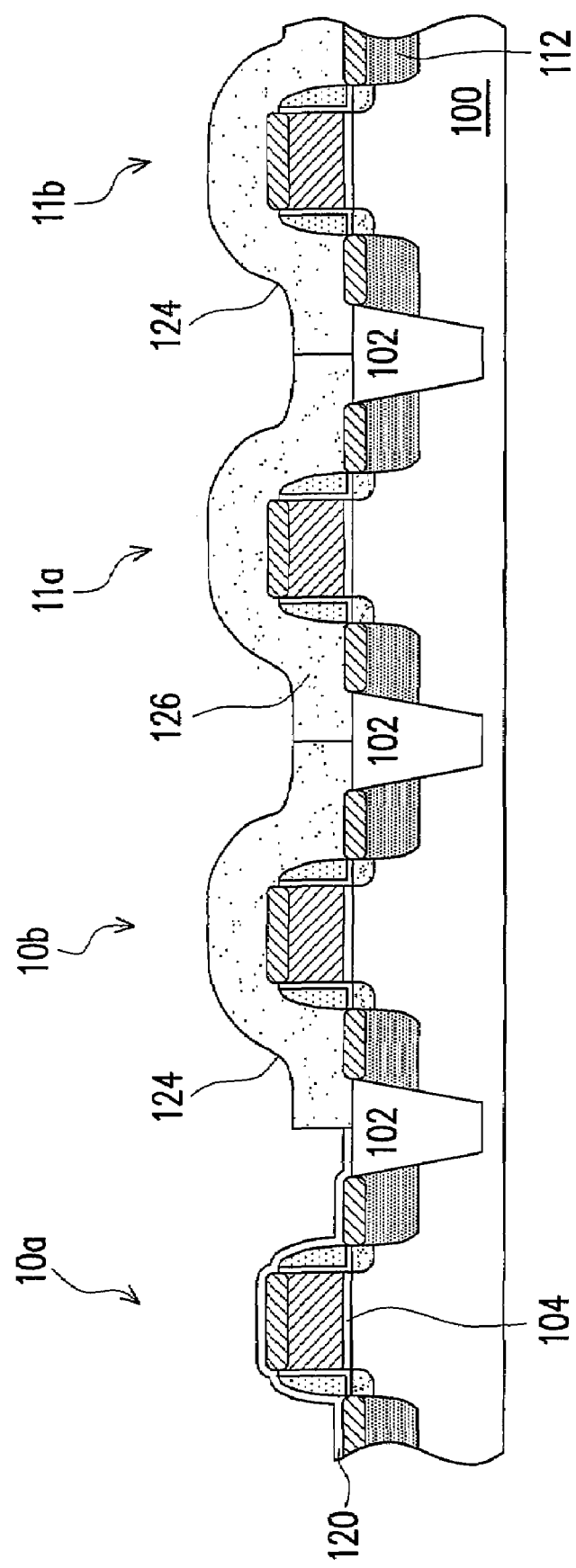
Figure 2:
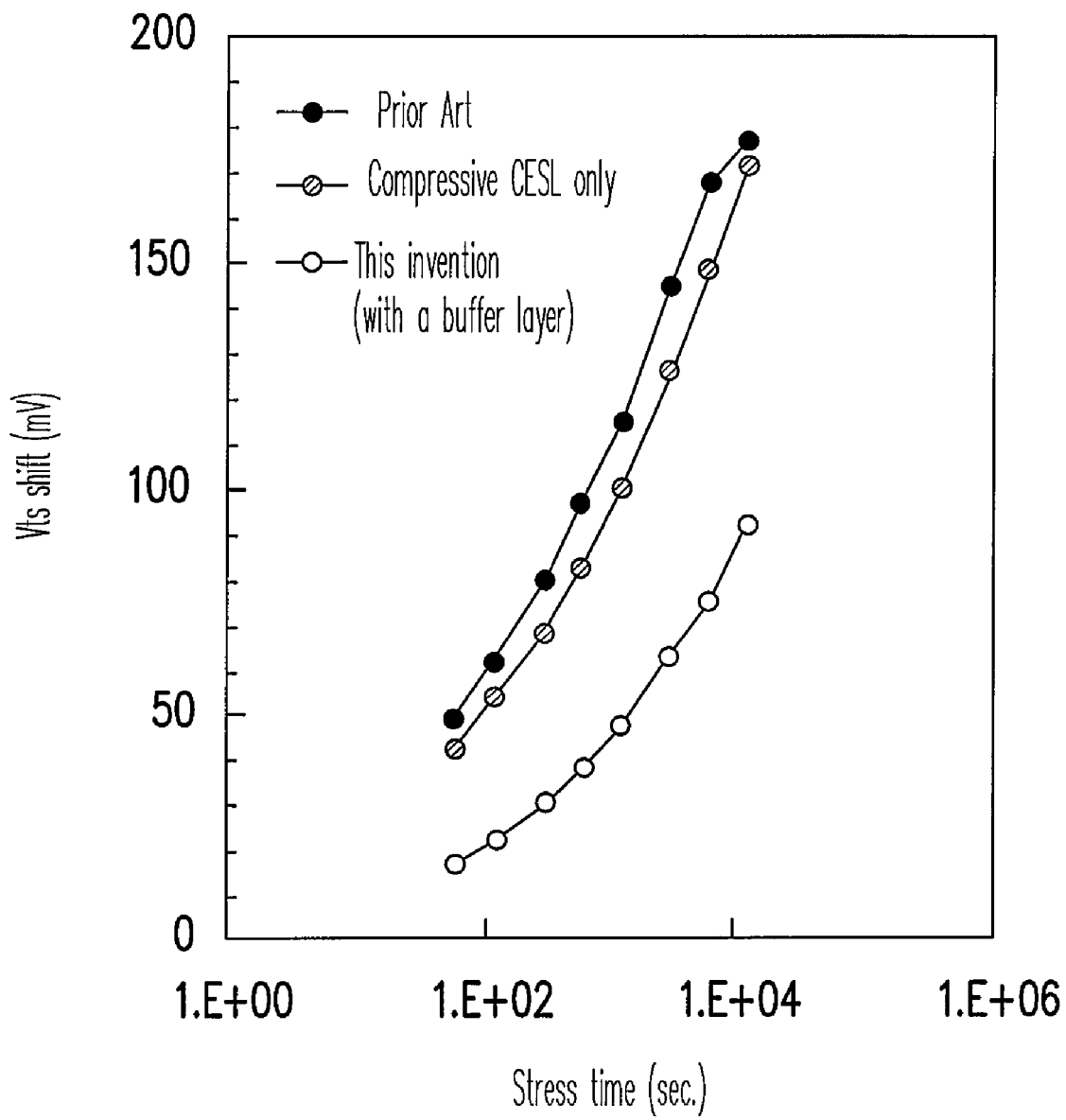

As shown in FIG. 1E, a compressive CESL 126 is formed over the core PMOS 11a.

Additionally, the sequence of FIG. 1D and FIG. 1E may be interchangeable according to demand. Moreover, the IO PMOS 10a is connected to a external power accepting higher voltage than other devices, the gate dielectric layer 104 of the IO PMOS is thicker than other devices, and the performance of the IO PMOS is not determined by velocity but by reliability. Therefore, it is unnecessary to form any CESL on a surface the buffer layer 120 in FIG. 1D or FIG. 1E. However, the formation of the two CESL is overall deposition. Thus, the tensile CESL 124 is optionally formed over the buffer layer 120 on the IO PMOS 10a in FIG. 1D; in the same reason, the compressive CESL 126 is optionally formed over the buffer layer 120 on the IO PMOS 10a in FIG. 1E.

To verify the performance of the present invention, refer to FIG. 2. FIG. 2 is a graph with curves showing an estimation of the NBTI between conventional IO PMOS and the one fabricated according to one preferred embodiment of the present invention. The horizontal axis represents the stress time and the vertical axis represents the Vts shift. As shown in FIG. 2, the location of the curve for a IO PMOS fabricated according to the present invention is significantly lower than that fabricated by the conventional process and the semiconductor device having only the compressive CESL. In other words, the Vts shift in the present invention is considerably lower than other structures for the same stress time.

In summary, a thin buffer layer is formed in the semiconductor device in the present invention so as to stop the diffusion of hydrogen atoms into the interface between silicon and silicon oxide. Hence, the negative bias temperature instability (NBTI) in the IO PMOS can be reduced and eliminated. Furthermore, the thickness of the buffer layer is thin enough to have very little impact on the resistance (Rs) of the underlying metal silicide layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a semiconductor device, comprising:
   providing a substrate;
   forming a plurality of IO devices and a plurality of core devices on the substrate, wherein the plurality of IO devices include at least one IO PMOS and at least one IO NMOS, and the plurality of core devices include at least one core PMOS and at least one core NMOS;

forming a buffer layer on the substrate;

removing the buffer layer except a surface of the IO PMOS;

forming a tensile contact etching stop layer (CESL) over the IO NMOS and the core NMOS; and forming a compressive contact etching stop layer (CESL) over the core PMOS.

2. The method of fabricating the semiconductor device of claim 1, wherein the buffer layer comprises a thin oxide film.

3. The method of fabricating the semiconductor device of claim 1, wherein the buffer layer has a thickness between about 10 Å to 200 Å.

4. The method of fabricating the semiconductor device of claim 1, wherein the step of forming the buffer layer comprises:

forming a cover film on the IO NMOS and the core devices except the IO PMOS; and performing a surface treatment on the substrate to form the buffer layer.

5. The method of fabricating the semiconductor device of claim 4, wherein the step of removing the buffer layer except the surface of the IO PMOS comprises removing the buffer layer by removing the cover film.

6. The method of fabricating the semiconductor device of claim 4, wherein the surface treatment comprises an oxygen plasma treatment.

7. The method of fabricating the semiconductor device of claim 6, wherein the oxygen plasma treatment comprises performing a physical vapor deposition process or performing a treatment using a photoresist-stripping tool.

8. The method of fabricating the semiconductor device of claim 1, wherein the step of forming the buffer layer comprises performing a CVD process.

9. The method of fabricating the semiconductor device of claim 1, wherein the step of forming the compressive contact etching stop layer over the core PMOS comprises forming the compressive contact etching stop layer over the buffer layer on the IO PMOS.

10. The method of fabricating the semiconductor device of claim 1, wherein the step of forming the tensile contact etching stop layer over the IO NMOS and the core NMOS comprises forming the tensile contact etching stop layer over the buffer layer on the IO PMOS.

* * * * *